United States Patent [19]

Bocchicchio et al.

[11] Patent Number: 4,717,304
[45] Date of Patent: Jan. 5, 1988

[54] ELECTRICAL CONNECTOR FEEDING APPARATUS

[75] Inventors: Keith A. Bocchicchio, Middletown; Glenn I. Hoffner, Mechanicsburg; Karl H. Letsch, Wyomissing, all of Pa.

[73] Assignee: AMP Incorporated, Harrisburg, Pa.

[21] Appl. No.: 927,194

[22] Filed: Nov. 4, 1986

[51] Int. Cl.$^4$ .............................................. H05K 13/02
[52] U.S. Cl. ...................................... 414/126; 29/809; 221/11; 221/197; 414/128; 414/129; 414/411; 414/417
[58] Field of Search ............... 414/126, 128, 129, 403, 414/404, 411, 413, 417; 29/741, 809; 221/11, 197

[56] References Cited

U.S. PATENT DOCUMENTS

| | | | |
|---|---|---|---|
| 3,308,977 | 3/1967 | Cochran et al. | 414/32 X |
| 3,809,253 | 5/1974 | Mercer | 414/18 |
| 4,552,260 | 11/1985 | Teagno et al. | 198/345 |
| 4,599,026 | 7/1986 | Feiber et al. | 414/413 X |
| 4,636,126 | 1/1987 | Spotts | 414/126 |
| 4,671,722 | 6/1987 | Ray et al. | 414/417 X |
| 4,677,745 | 7/1987 | Ihara | 29/741 |

Primary Examiner—Leslie J. Paperner
Attorney, Agent, or Firm—Thomas G. Terrell

[57] ABSTRACT

Apparatus (24) for feeding electrical connectors from slide packs (SP), to a pick and place robot (2), comprises an elevator (44) which is raised to pick the lowermost pack (SP') from a stack of packs (SP) in a magazine (36). The elevator (44) is then lowered into a connector feed position in which a ram (54) on a flexible chain (52) is run step by step through the pack (SP') on the elevator (44) to place each connector (C) in the pack (SP'), in turn, at a pick-up station (26) to be picked up by the robot (2). When the pack (SP') on the elevator (44) has been emptied of connectors (C), the elevator (44) is raised and the ram (54) is advanced in one stroke beneath pack (SP') on the elevator (44) and a latch (56) on the ram (54) rises to engage the end of the empty pack (SP') nearest to the pick-up station (26). The ram (54) is then retracted, in one stroke, to eject the empty pack (SP') from the apparatus (24).

15 Claims, 26 Drawing Figures

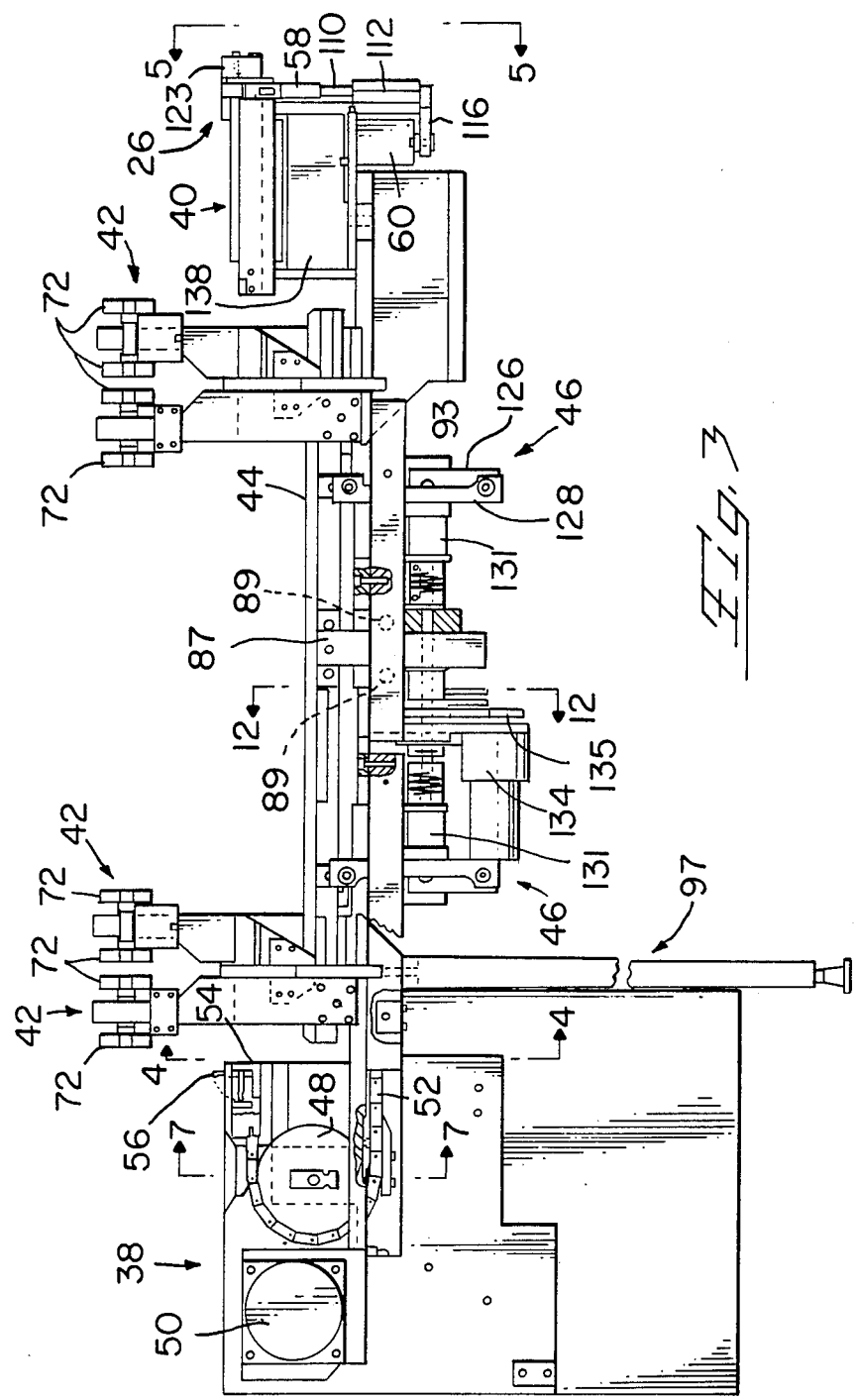

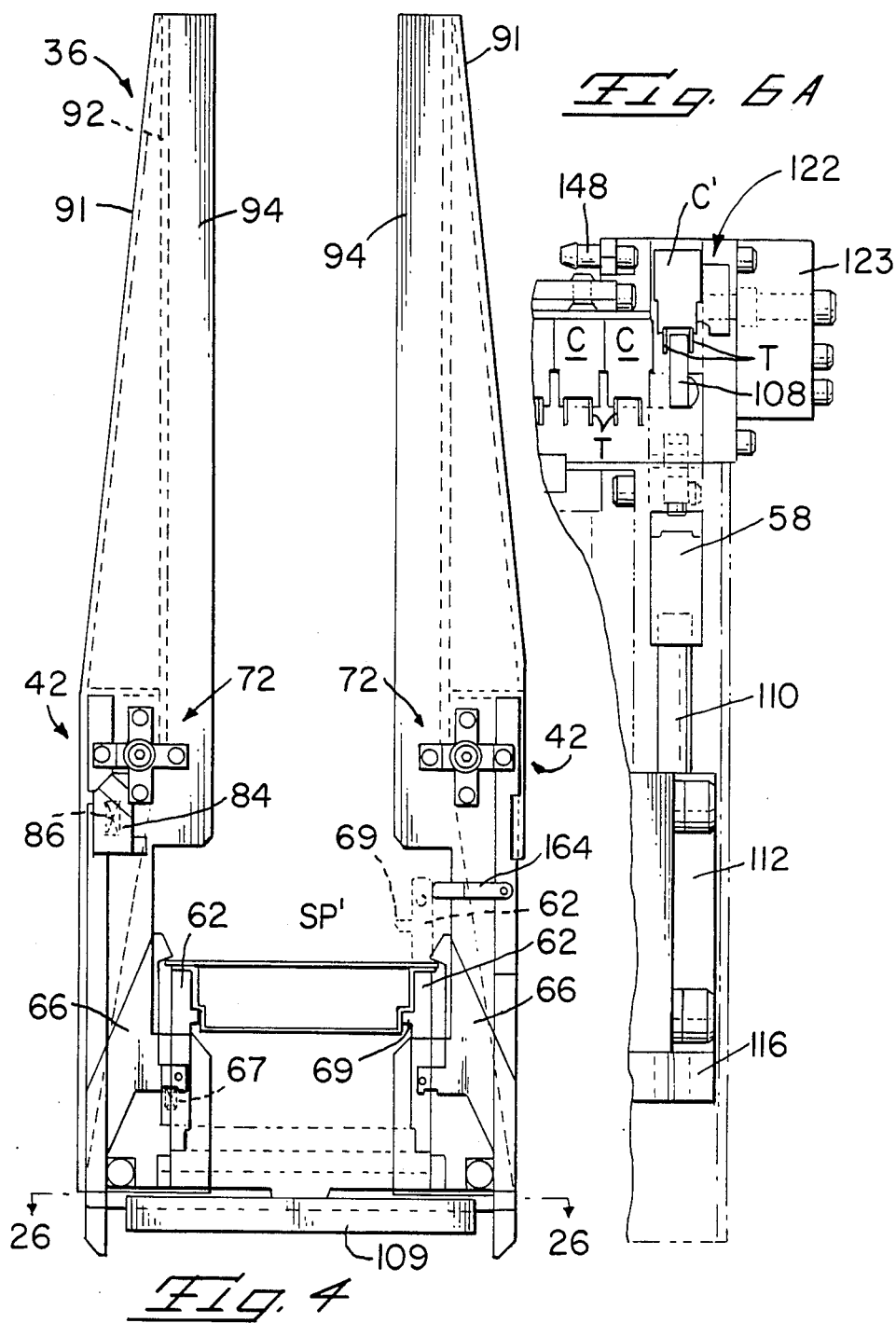

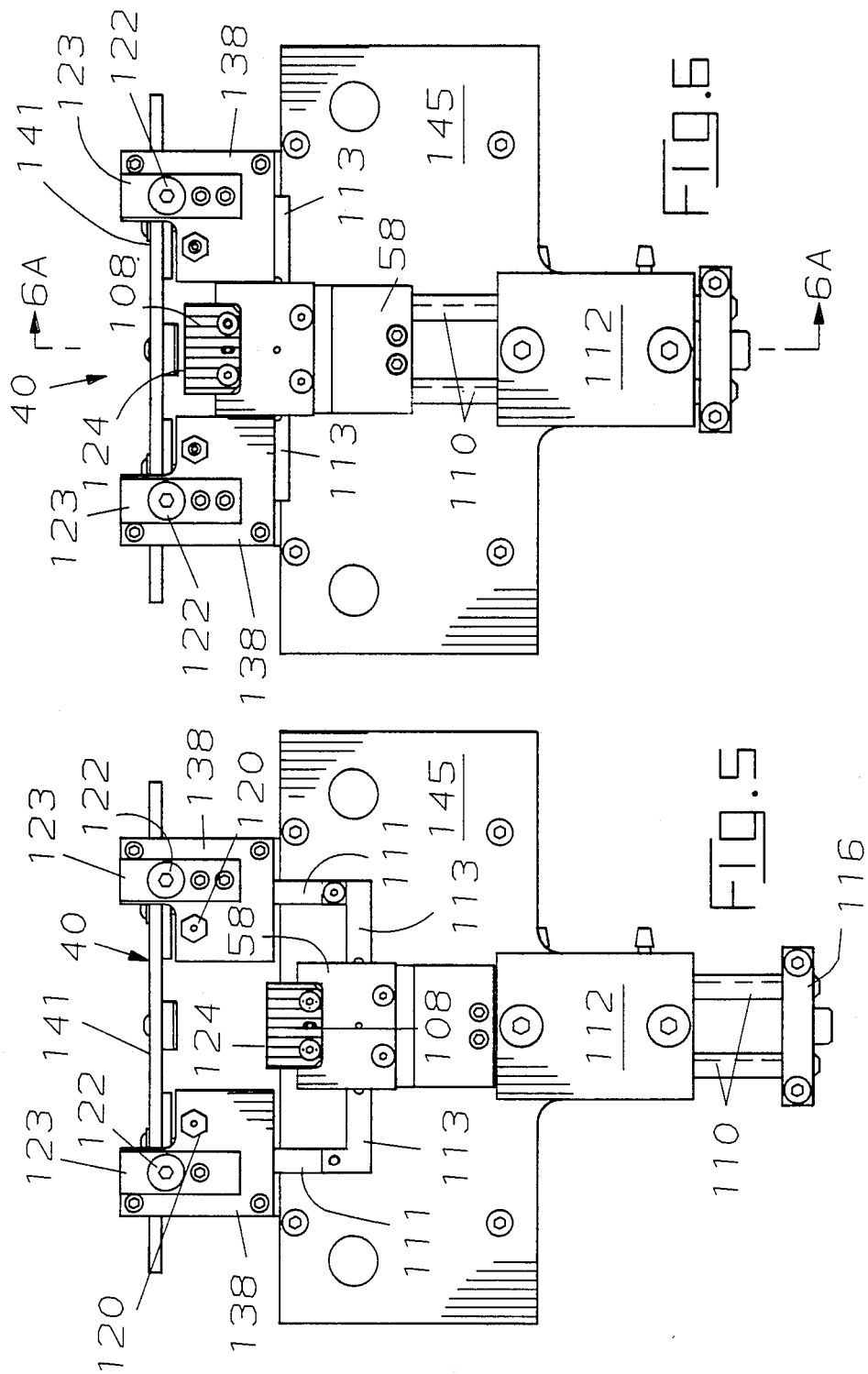

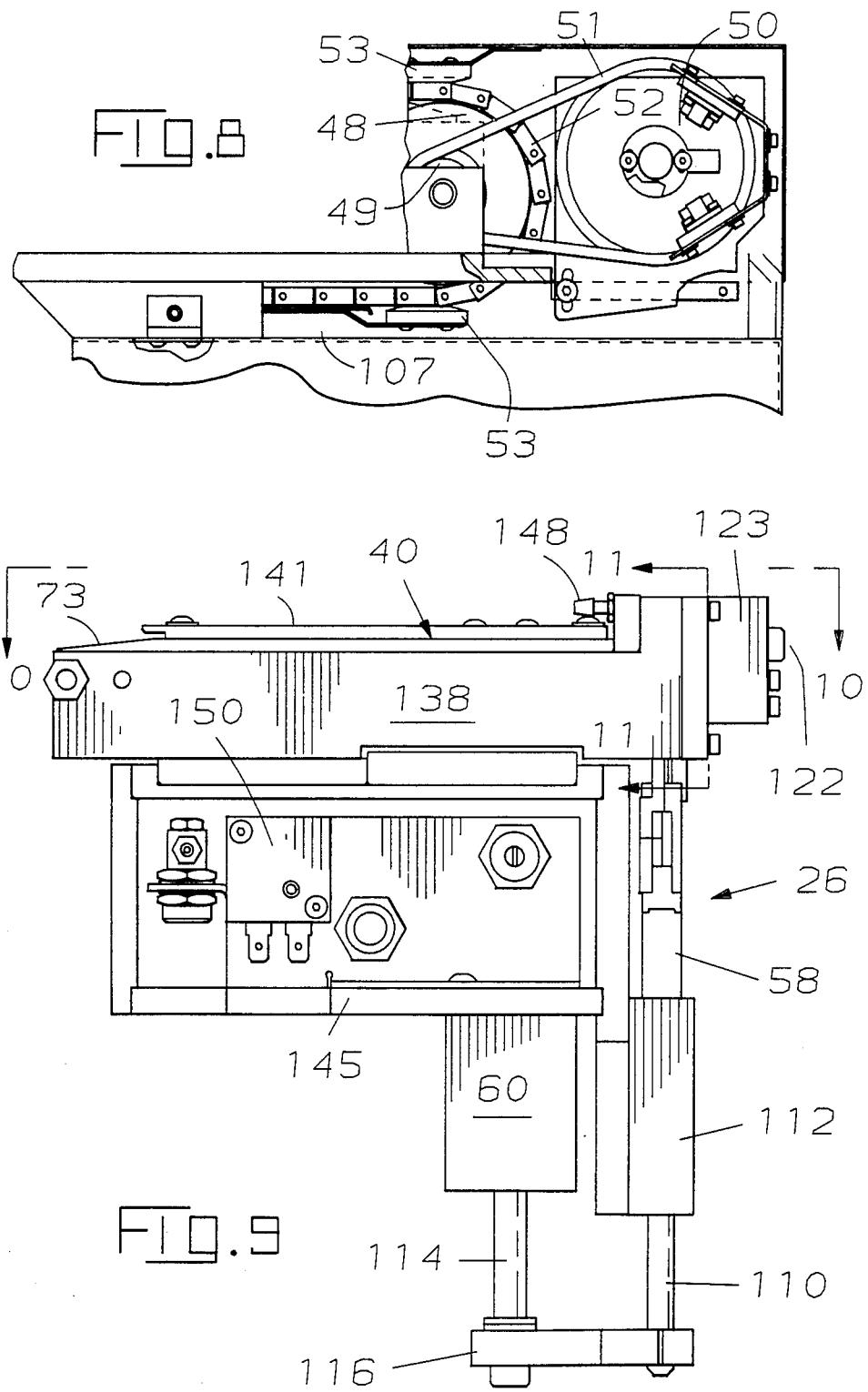

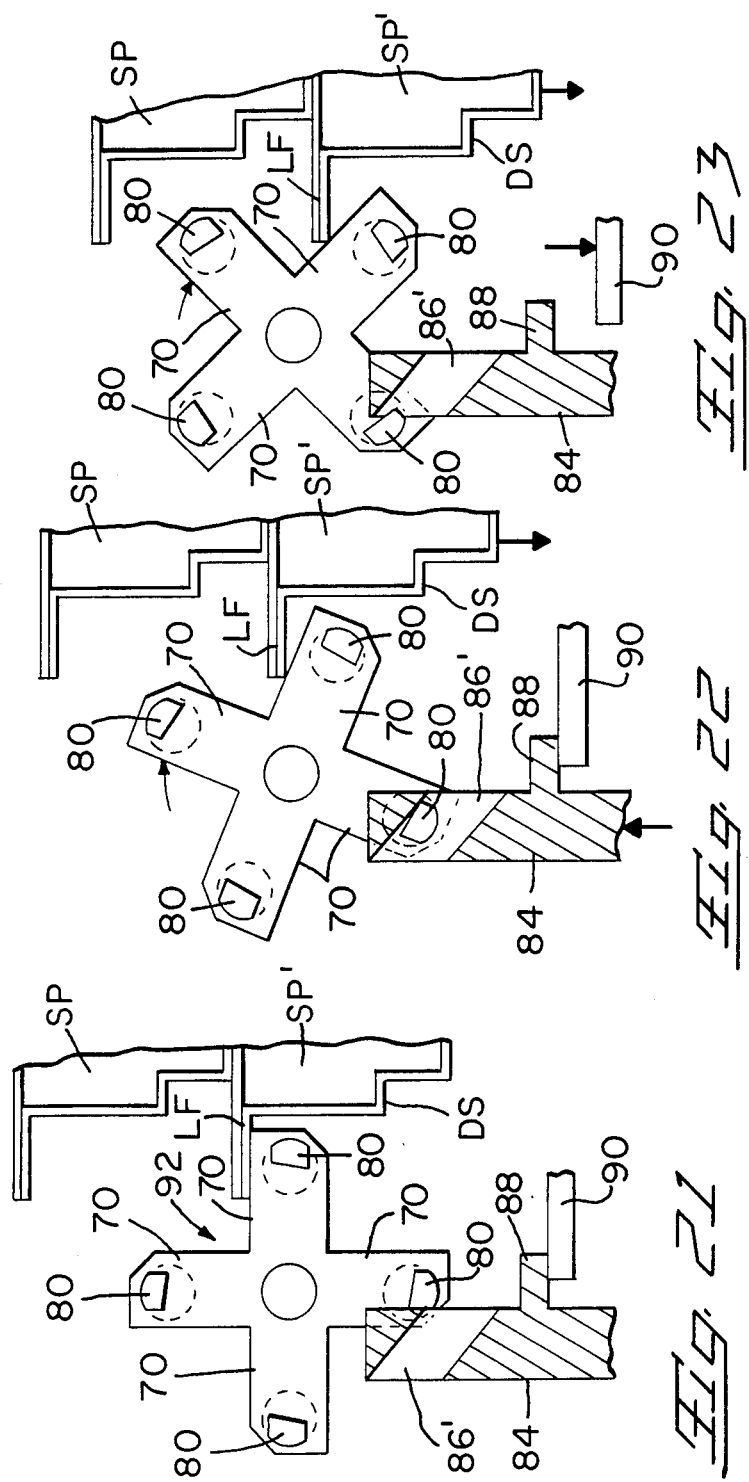

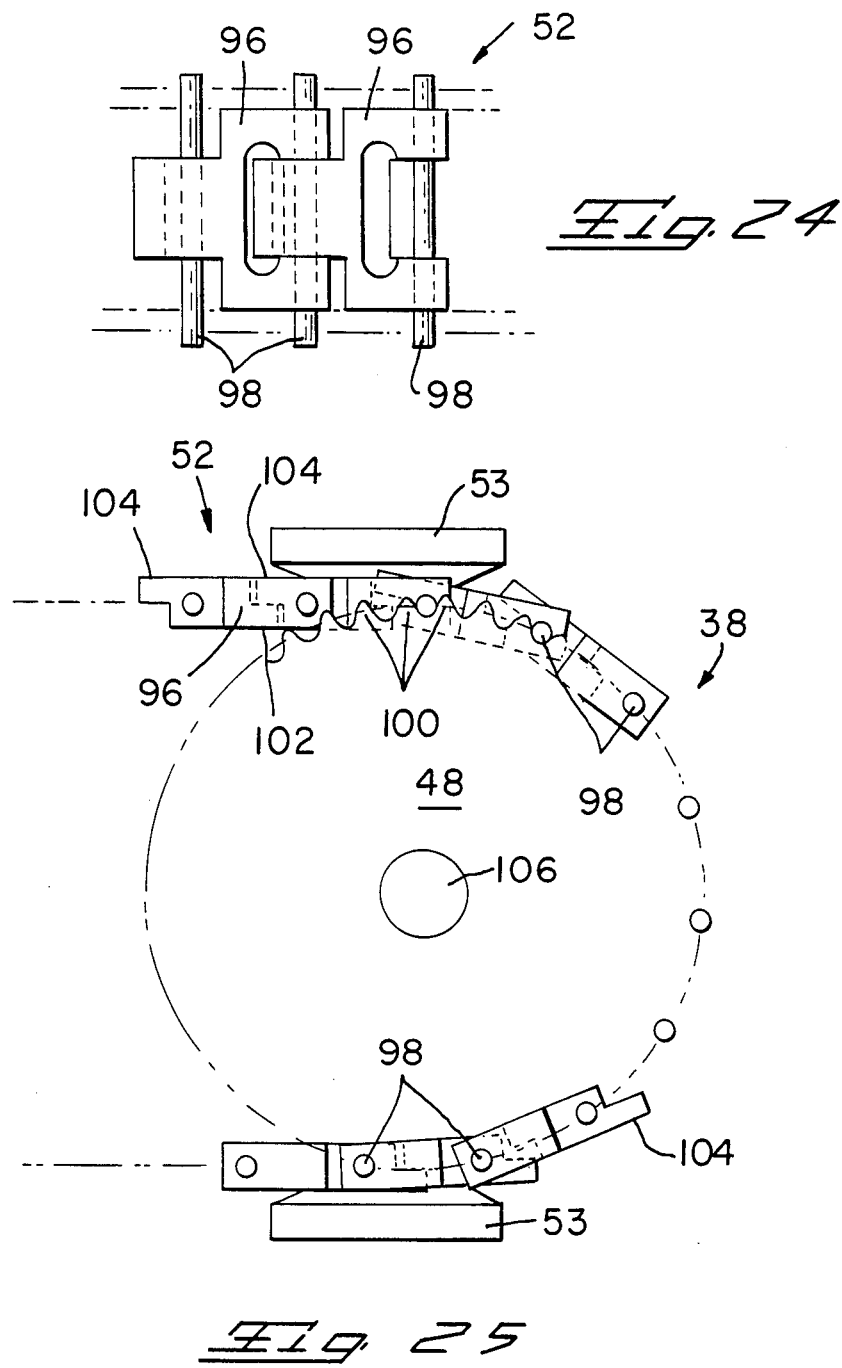

ELECTRICAL CONNECTOR FEEDING APPARATUS

This application relates to apparatus for sequentially feeding electrical connectors arranged in rows in elongate tubular packs, usually known as "slide packs" for pick-up by connector pick-up means, for example by the pick-up head of a pick and place robot for assembling the connectors to circuit boards.

Although a slide pack may be arranged vertically, to feed the connectors therein by way of guide tracks and a connector reservoir, to a connector pick-up station, each exhausted slide pack must be replaced manually by a full slide pack, before the reservoir is exhausted, if continuity of connector supply to the robot pick-up head is to be maintained during circuit production.

In order to mitigate this disadvantage, it is proposed, according to the invention, to provide apparatus which is capable of taking each pack in turn from a stack of slide packs, aligning it with the pick-up station, feeding each connector in turn from the slide pack to the pick-up station, ejecting the exhausted slide pack from the apparatus, and placing another slide pack taken from the stack in alignment with the pick-up station.

According to the invention, the stack of slide packs is arranged with the packs extending horizontally, in a magazine provided by a frame. An elevator arranged in the frame, below the magazine, is arranged to pick-up the lowermost pack of the stack, and to lower it to a pick-up position in alignment with the pick-up station, after which a ram, which may be carried by a flexible chain, is advanced through the pack on the elevator, step by step, to push the connectors along the pack and thus to position each connector in turn at the pick-up station for pick-up, for example, by the robot pick-up head. When the pack on the elevator has been exhausted, the ram is retracted from the exhausted pack, the pack is raised and the ram is then advanced again towards the pick-up station beneath the exhausted pack. The ram has means thereon for engaging that end of the exhausted pack which is nearest to the pick-up station, so that by retracting the ram, the exhausted pack can be ejected from the apparatus.

Escapement means for supporting the lowermost pack of the stack, may be released by means on the elevator, to allow the lowermost pack to be carried down by the elevator into alignment with the pick-up station.

It is an advantage of the apparatus of the invention that for positioning the packs to allow connectors to be fed therefrom for feeding the connectors from the packs and for ejecting the exhausted packs from the apparatus, only two driven elements are needed, namely the elevator and the ram.

Advantageously, the chain, by which the ram may be carried, is so constructed that it cannot buckle during its connector feeding stroke. The pack-engaging means of the ram may be in the form of a simple, resiliently depressable, latch member.

In order to enable the use of a one axis compliant robotic gripper head, the pick-up station is preferably provided with means for horizontally aligning each connector at the pick-up station, in a predetermined position, so that the robot will know where it pick it up.

Means are also preferably provided for raising each connector at the pick-up station to facilitate its being gripped by the jaws of the robot gripper head.

Conveniently, the ram is driven by a reversible, rotary air motor, and the elevator is driven sequentially and consecutively, between its pack pick-up, its connector feed, and its pack-eject positions, through a linkage operated by a unidirectional rotary drive means.

Slide packs are usually closed at each end by a hinged flap. Prior to the packs being loaded into the magazine, one of these flaps, that is to say, the flap which is to be remote from the connector pick-up station when the pack is in the magazine, is removed, means being provided for raising the other flap to allow the connectors to be fed from the magazine, as each pack is lowered by the elevator, as the elevator is moved towards its connector feed position.

For a better understanding of the invention and to show how it may be carried into effect reference will now be made by way of example to the accompanying drawings in which:

FIG. 3 is a side view, shown partly in section, of apparatus for sequentially feeding connectors from a stack of packs of the kind shown in FIG. 2 for pick-up by the robot;

FIG. 4 is a view taken on the lines 4—4 of FIG. 3;

FIG. 5 is a view taken on the lines 5—5 in FIG. 3;

FIG. 6 is a similar view to that of FIG. 5 but showing a different position of the parts thereof;

FIG. 6A is a fragmentary view taken on the lines 6A—6A of FIG. 6;

FIG. 8 is a view taken in the direction of the arrow 8 in FIG. 7;

FIG. 9 is a view taken on the lines 9—9 of FIG. 5;

FIGS. 21 to 23 are diagrammatic side views illustrating the operation of escapement mechanisms of the apparatus;

FIG. 24 is a fragmentary plan view of a ram carrying chain of the apparatus;

FIG. 25 is a fragmentary side view of the chain; and

Figure 1:
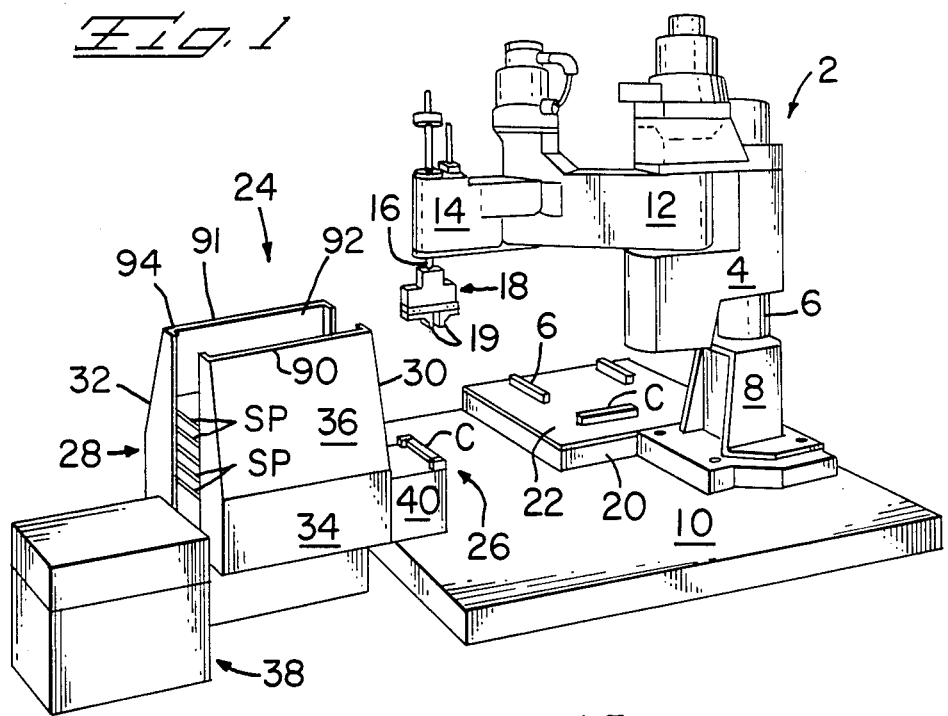
FIG. 1 is a diagrammatic isometric view of a robot in use in the assembly of electrical connectors to a circuit board.

As shown in FIG. 1, a robot 2 comprises a body 4 mounted for rotation about, and movement along, the axis of a vertical shaft 6 in a stand 8 secured to a worktable 10. Mounted on the body 4 for rotation about a vertical axis is a first arm 12 carrying at its end remote from the body 4, a second arm 14 which is rotatable relative to the arm 12, also about a vertical axis. A shaft 16 which is rotatable about a vertical axis and which is also extensible and retractable along such axis depends from the arm 15 at its end remote from the arm 12. The body 4 is clamped, prior to use of the robot 2, in a desired angular position and in a desired vertical position with respect to the shaft 6. The rotation of the arms 12 and 14, and the shaft 16, as well as the axial vertical movement of the shaft 16 are selectively controllable by means of a microprocessor (not shown) in accordance with a predetermined program. A gripper head 18 having connector gripper jaws 19 is fixedly mounted on the shaft 16.

A support 20 for a circuit board 22 is mounted on the table 10 for the placement thereon, by the robot 2, of elongate electrical connectors C.

Beside the table 10, is a connector feed apparatus 24 containing a stack of slide packs SP each having therein a supply of the connectors C. The apparatus 24 is arranged to position each pack SP of the stack, in a feed position, and to feed each connector from the pack, in turn, to a pick-up station 26, to be picked up by the jaws 19 of the head 18 of the robot 2 and placed on the circuit board 22.

Figure 2:
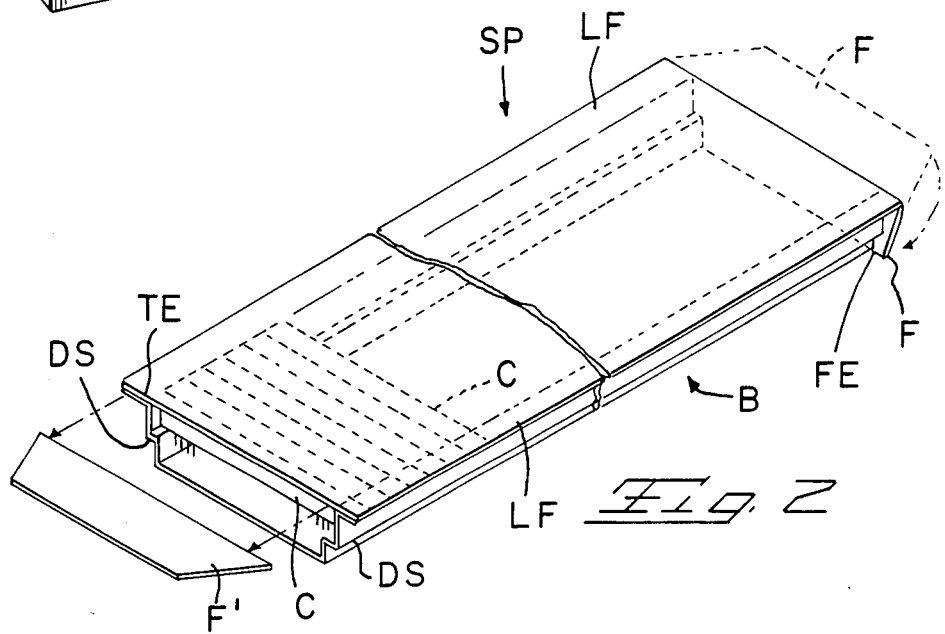
FIG. 2 is an enlarged isometric view of a slide pack containing electrical connectors.
Figure 7:
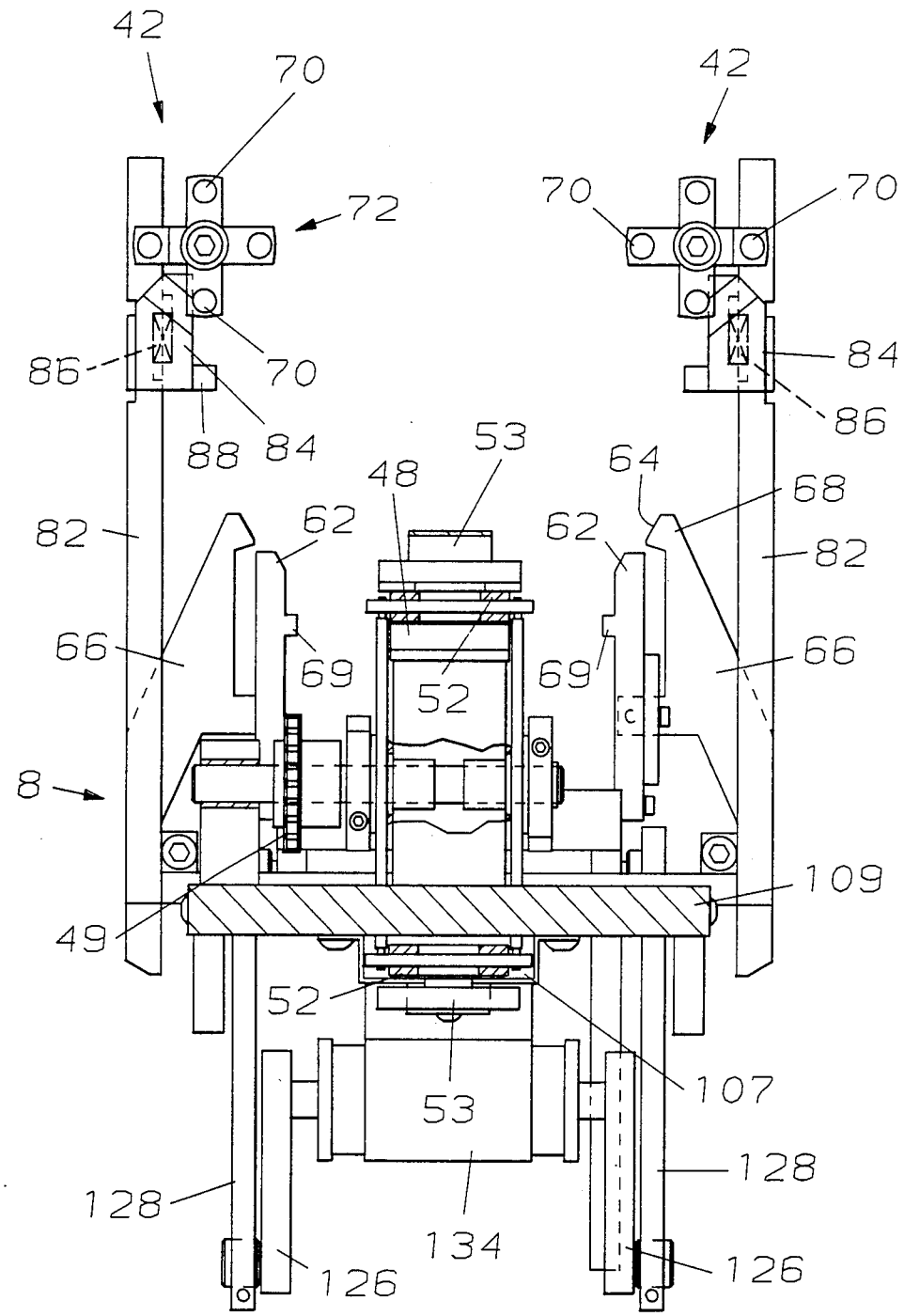
FIG. 7 is a view taken on the lines 7—7 of FIG. 3.

As shown in FIG. 2, each slide pack SP comprises an elongate, rectangular cross section, tubular plastics body B containing a row of connectors C which are slidably arranged side by side in the body B for movement longitudinally thereof. When the pack SP is supplied to the circuit maker, the open ends of the body B are closed by hinged flaps F, secured by adhesive tapes (not shown) to prevent the connectors C escaping from the body B through said open ends. Prior to the packs SP being stacked in the apparatus 24, the said tapes are removed and flap F' at one end of the body B is torn therefrom to allow a ram, described below, of the apparatus 24, to be moved through the body B. The other flap F is raised in the apparatus 24, by means described below, to allow the ram to feed the connectors C one by one from the body B.

The apparatus and its operation will now be described in outline. As shown in FIG. 1, the apparatus 24 comprises an elongate frame 28 having a first end 30, a second end 32, a lower part 34, and an upper magazine part 36, containing said stack of packs SP with the packs SP extending lengthwise of the frame 28. The apparatus also comprises a ram drive assembly 38 and a connector connecting tray 30 which extends from said lower part 34 and comprises at its end nearest the robot 2, the pick-up station 26.

Connected to said upper part 36 are releasable escapement means 42 which are best seen in FIGS. 3, 12–14, and are described in detail below with particular reference to FIGS. 21 and 22. A pack transfer elevator 44 extends beneath the stack of packs SP, for substantially the whole length thereof and is mounted in the lower part 34 of the frame 28 for vertical movement towards and away from said upper part 36, by means of linkages 46. The ram drive assembly 38 comprises a first sprocket wheel 48 driven through a second sprocket wheel 49 by a reversible rotary pneumatic motor 50 and through a toothed belt 51, as best seen in FIG. 8. A chain 52 driven by the wheel 48 has fixed to one end thereof a connector feed and pack eject ram 54 having thereon a depressable pack latch 56 and being drivable through said lower part 34 of the frame 28 by means of the motor 50. The chain 52 is guided by drag plates 53.

The station 26 comprises a connector raising slide 58 which is driven in vertical reciprocating motion by an pneumatic piston and cylinder unit 60.

Figure 10:
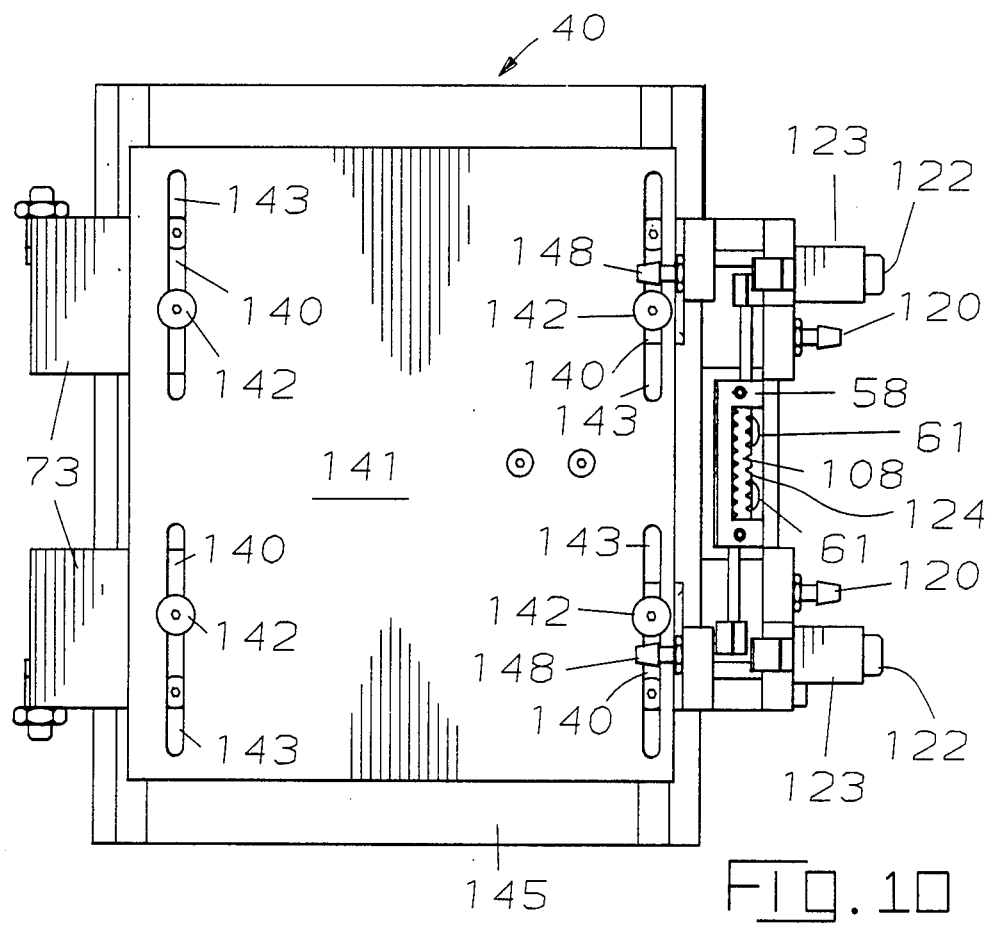
FIG. 10 is a view taken on the lines 10—10 of FIG. 9.
Figure 12:
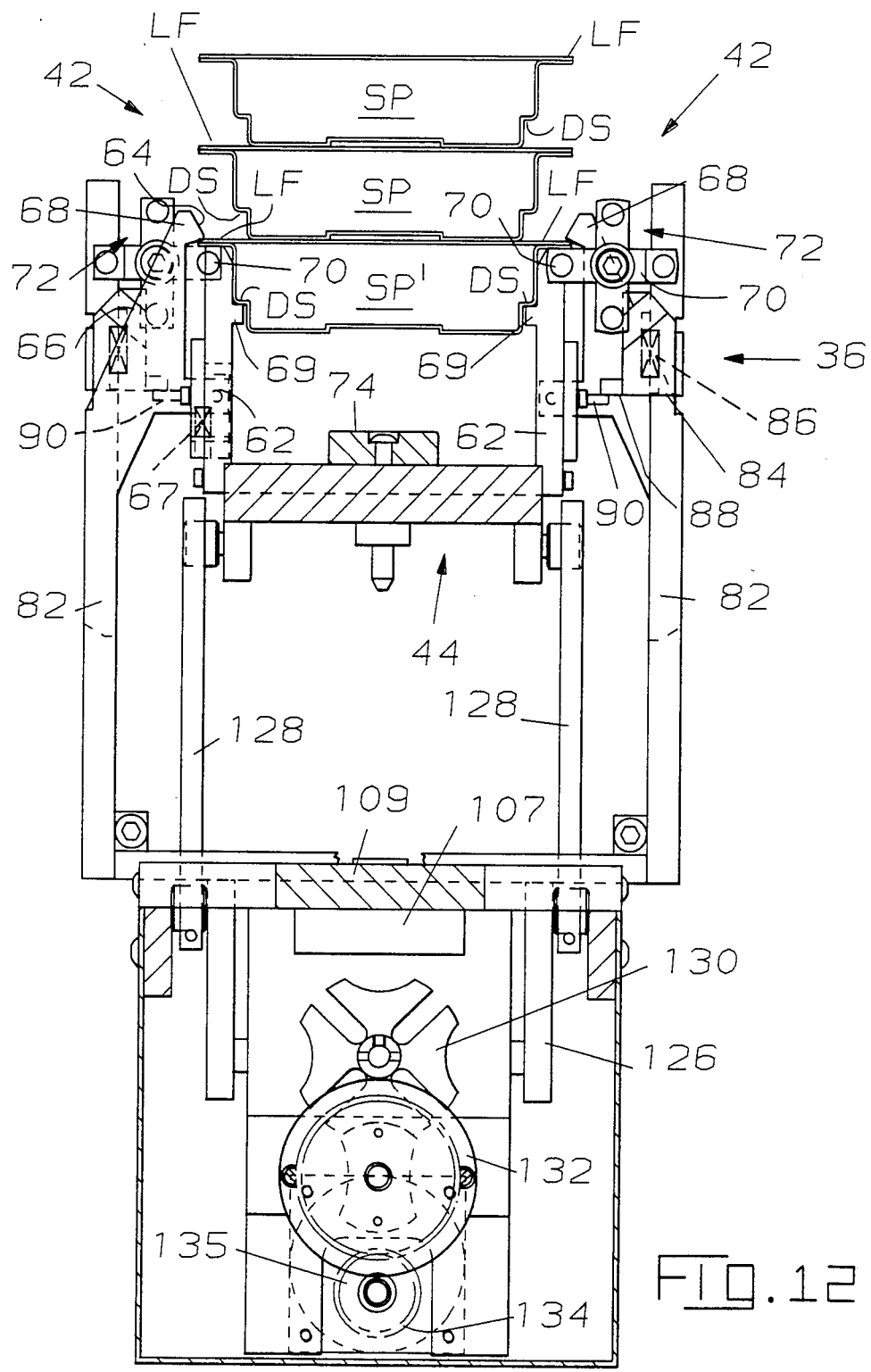
FIG. 12 is a view taken on the lines 12—12 of FIG. 3 showing parts of the apparatus in a start position.
Figure 13:
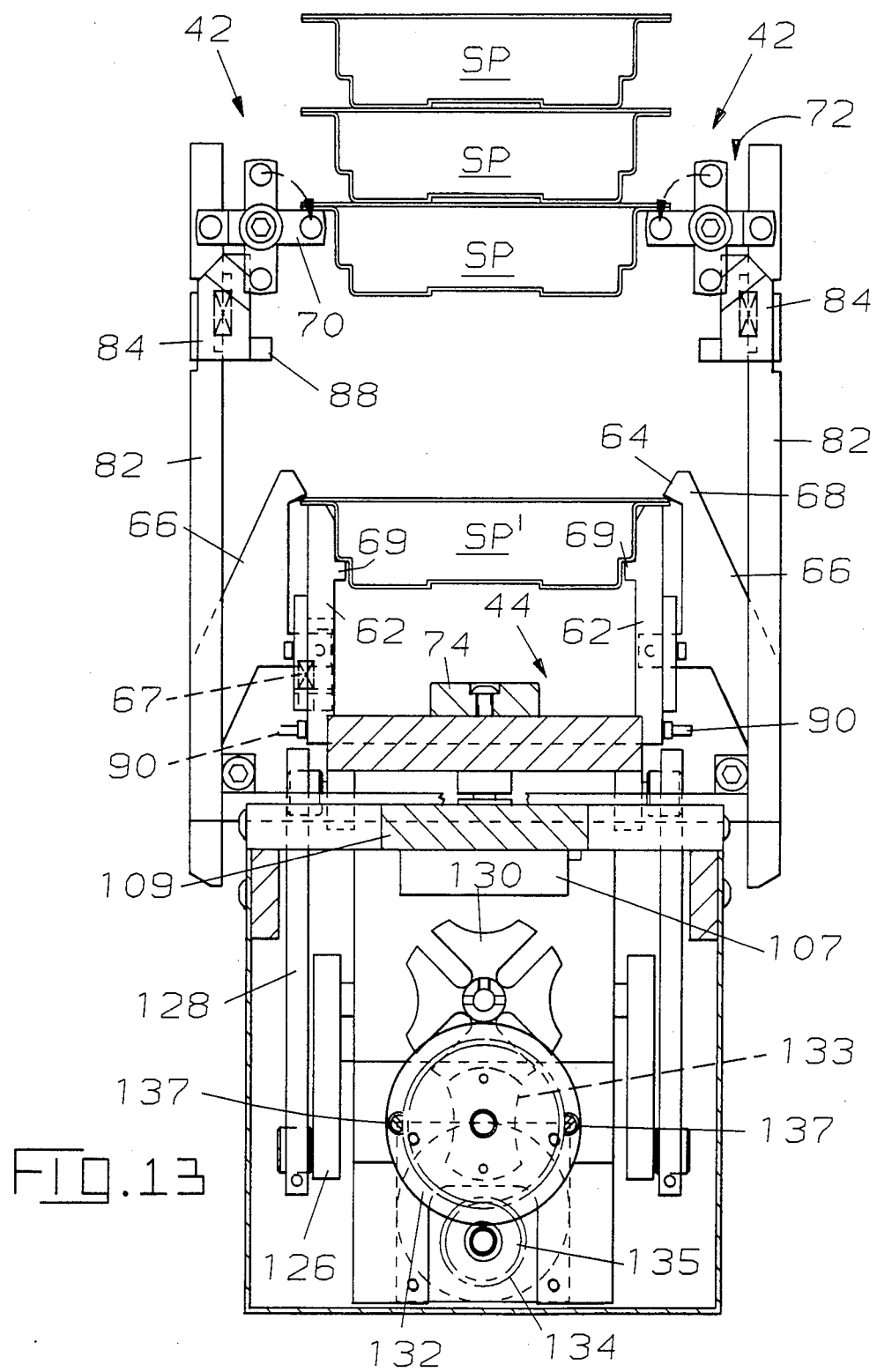
FIGS. 13 and 14 are similar views to that of FIG. 12, but showing the parts at respective stages during a cycle of operation of the apparatus.
Figure 14:
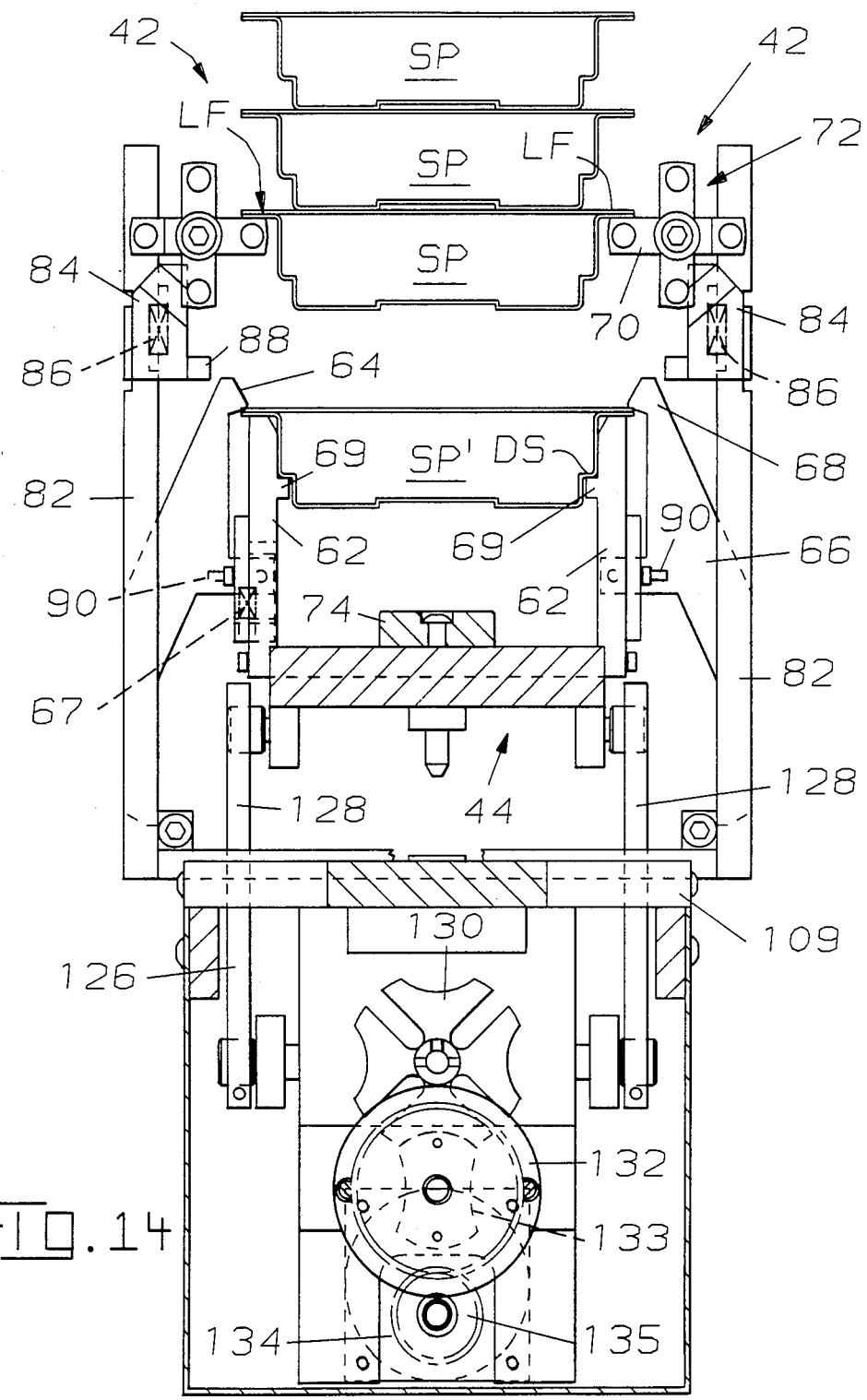
Figure 15:
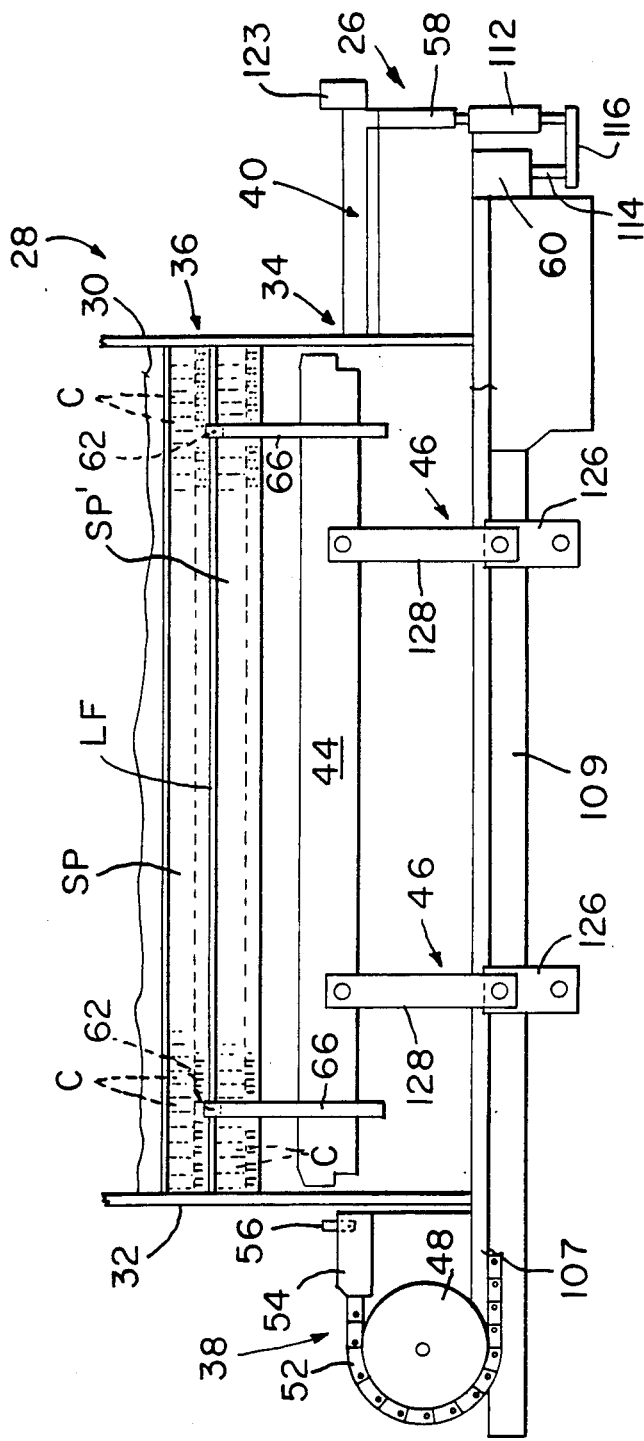
FIGS. 15 to 20 are diagrammatic side views illustrating successive stages in said cycle of operation.
Figure 16:
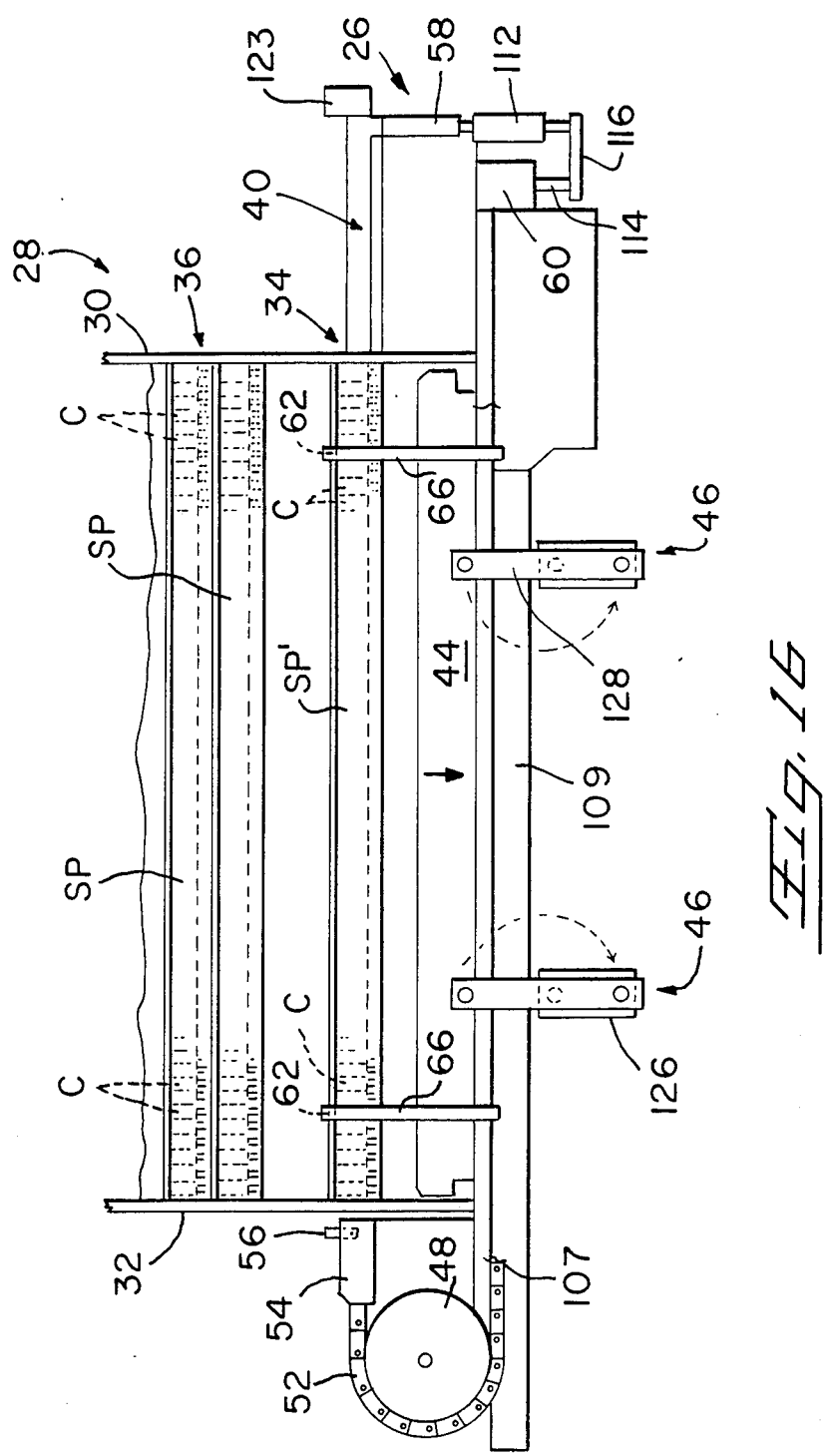
Figure 17:
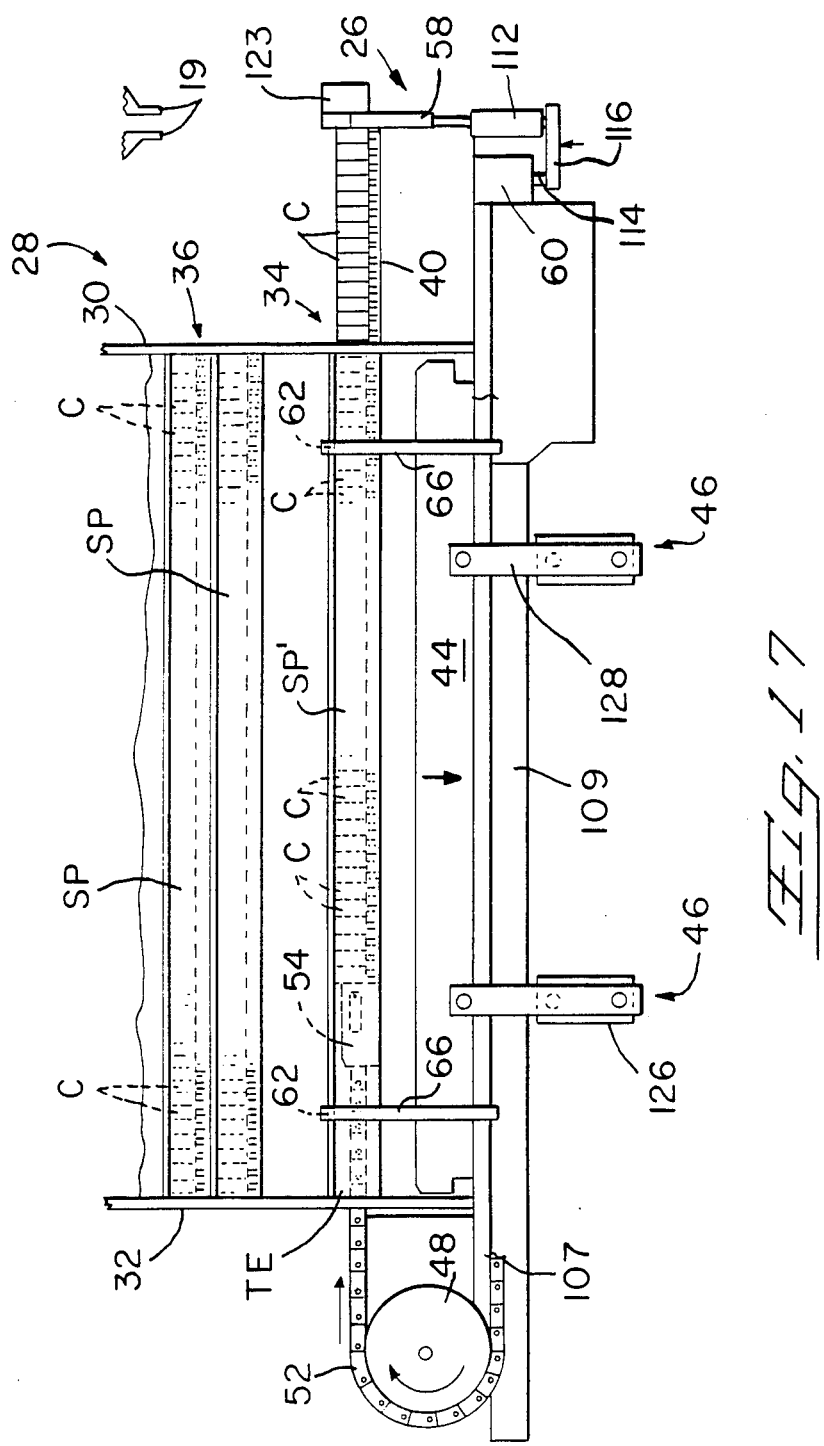
Figure 18:
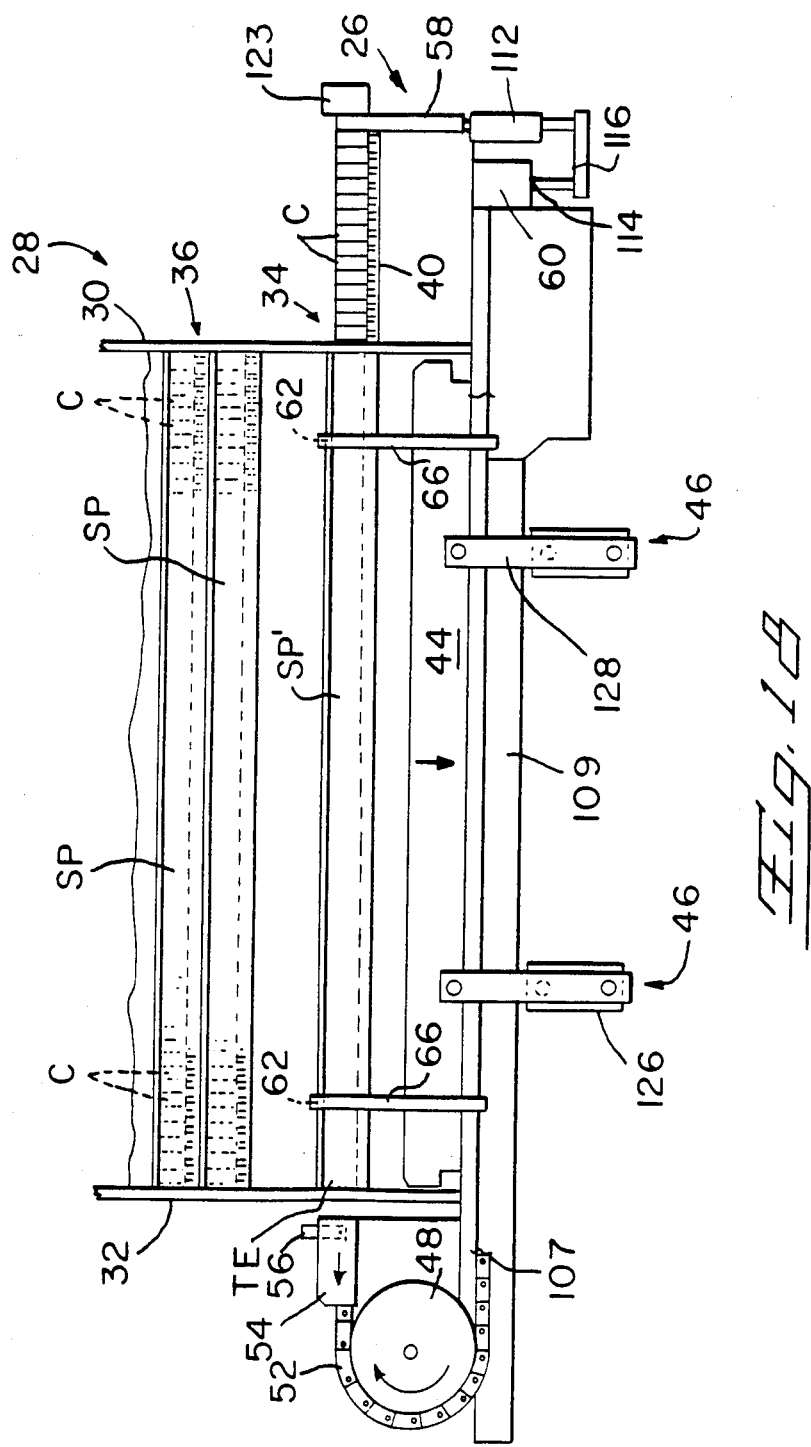

A cycle of operation of the apparatus 24 will now be described in outline, with particular reference to FIGS. 12 to 20. FIGS. 12 and 15 show the elevator 44 in a fully raised, starting and slide pack pick-up position, in which position the stack of slide packs SP is loaded into the magazine part 36 of the frame 28. As best seen in FIGS. 2 and 12 to 14, each pack SP has projecting from each of its upper edges, a longitudinal lateral flange LF. The longitudinal side walls of the pack SP each define a downwardly facing shoulder DS. When the stack has been loaded into said magazine part 36, the flanges LF of the lowermost pack SP' of the stack, rest upon the tops of four pack pick-up arms 62 secured to the elevator 44, as shown in FIG. 12. When the stack is loaded into the apparatus, these flanges LF engage cam surfaces 64 on four spring loaded pack latch arms 66 on the elevator 44, so as to push them away from one another against the action of springs 67, after which the arms 66 resile so that latch heads 68 thereon engage over the flanges LF of the pack SP', thereby securing it to the elevator 44. The shoulders DS of the pack SP' rest on lugs 69 projecting inwardly from the arms 62. Each flange LF of the pack SP' also rests upon an arm 70 of a star wheel 72 of an adjacent escapement means 42. Each wheel 72 is mounted for free rotation to the part 36 of the frame 28 but is releasably secured in a fixed angular position by latch means described below. In this fully raised position of the elevator 44, the star wheels 70 had been freed to rotate through 90 degrees, by release of the latch means as described below, to free the pack SP' from the stack. The elevator 44 is now driven down by the linkages 46 to the fully lowered connector feed position in which it is shown in FIGS. 13 and 16 in which the pack SP' is aligned with the tray 40 and thus with the pick-up station 26. During the descent of the elevator 44, the flap F which remains on the pack SP'. engages cam surfaces 73 (FIGS. 9 and 10) projecting back from the top of the tray 40 and is thereby opened so as to rest on tray 40. At this stage in the cycle of operation, the ram 54 is, as shown in FIG. 16, in a retracted position just beyond the end 32 of the frame 28. The motor 50 is now actuated according to the said program, to drive the ram 54 intermittently, that is to say step wise, through the pack SP', each step corresponding to the width of a connector C in the pack SP' (FIG. 17). At each step of the motor 50, a connector C is driven into the pick-up station 26 to be raised above the other connectors C in the tray 40, by means of the slide 58 for pick-up by the jaws 19 of the pick-up head 18 of the robot 2. The jaws 19 pick-up a connector C following each step of the motor 50, until the pack SP' has been exhausted of connectors C. The ram 54 is then retracted, in one step, to its starting position, by the motor 50 (FIG. 18).

Figure 19:
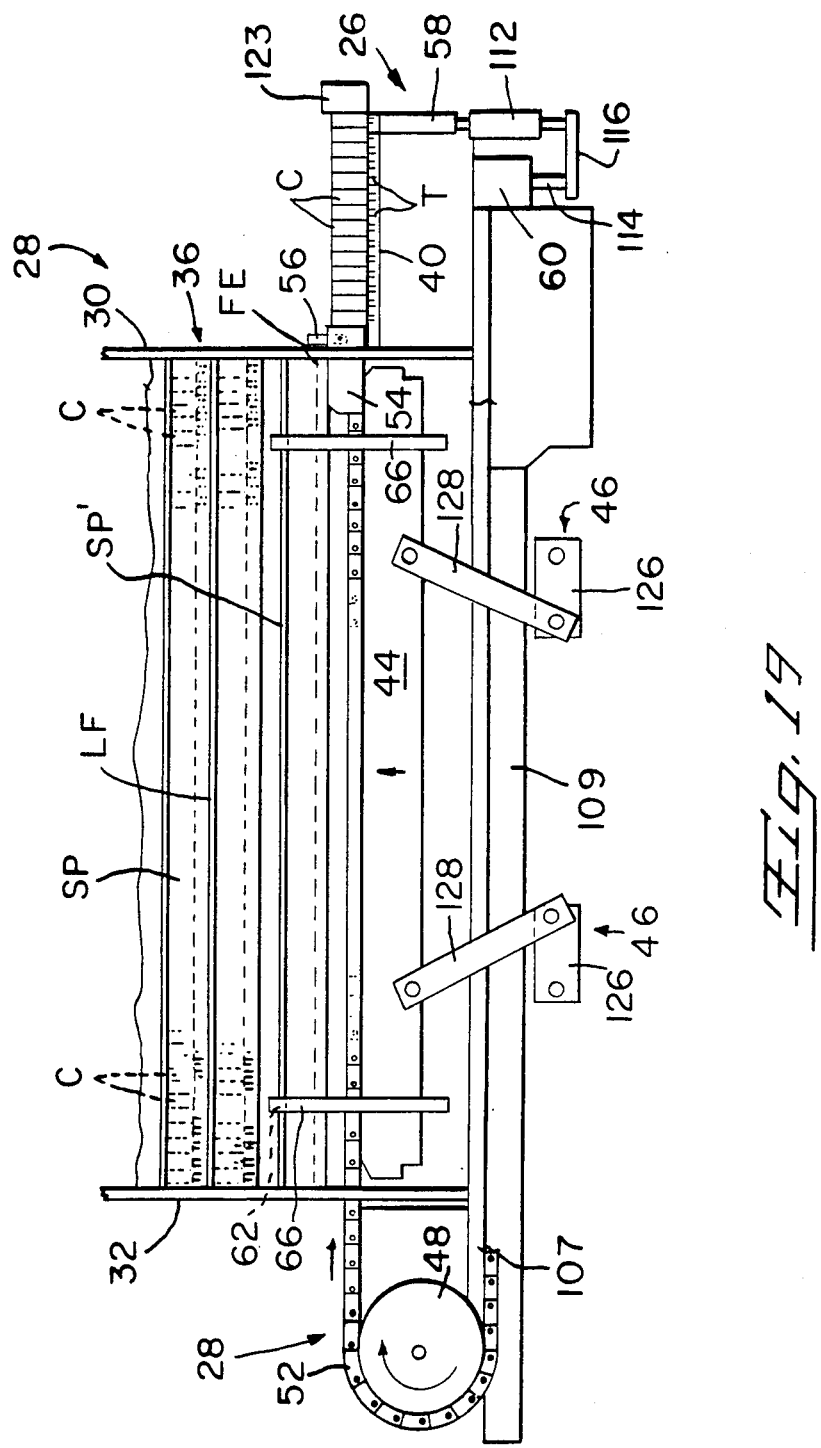
Figure 20:
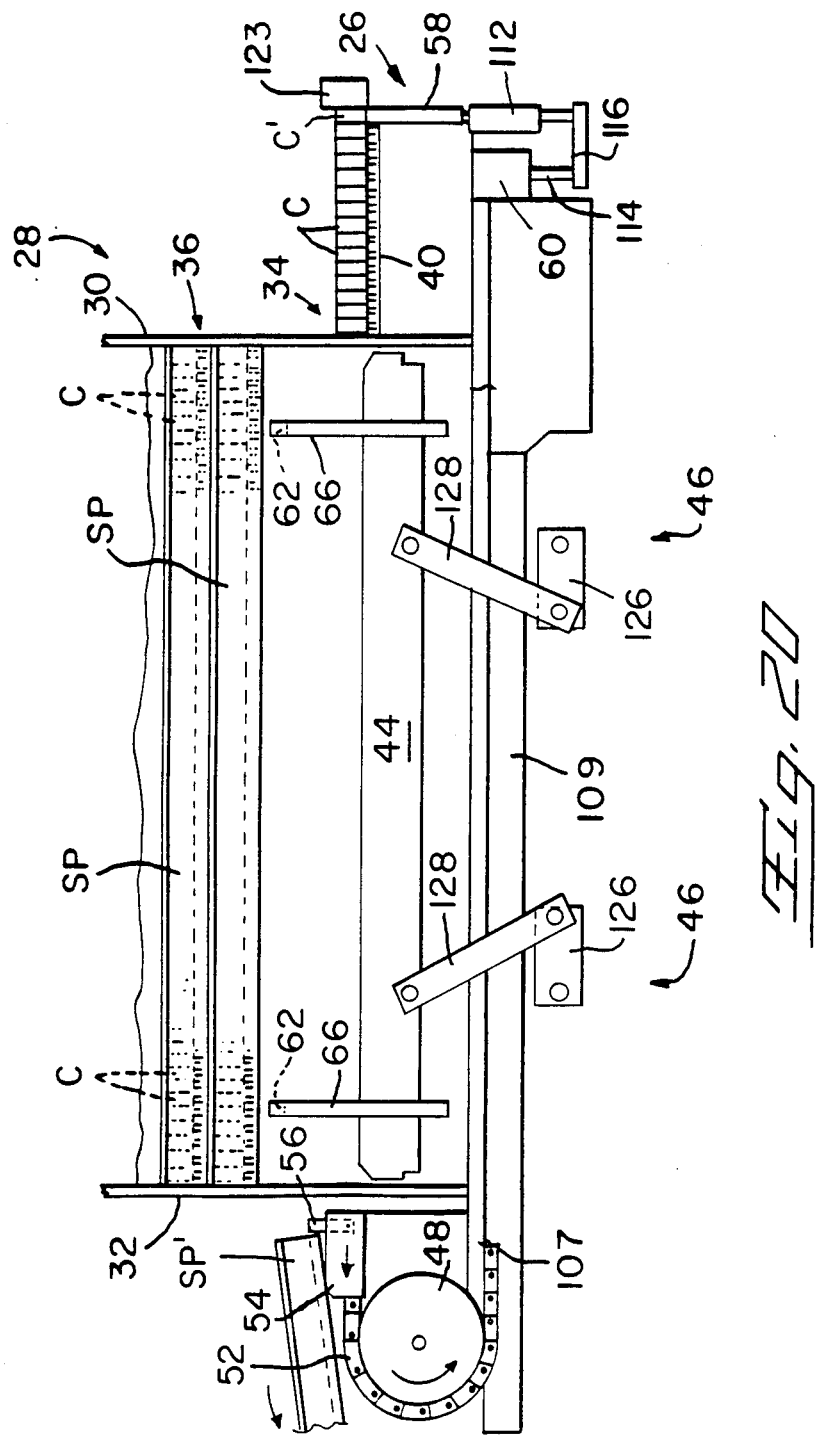

During the progress of the ram 50 through the pack SP', the latch 56 on the ram 54 was held in a depressed position by the top wall of the pack SP' having been initially depressed by the top edge of the pack SP', nearest to the end 32 of the frame 28. As shown in FIGS. 14 and 19, the elevator 44 is now raised by the linkages 46 to its intermediate pack eject position in which the ram 54 is aligned with a ram slide way 74 on the upper face of the elevator 44, so that the ram 54 can slide threalong. The ram 54 is now driven by the motor 50, in one step, beneath the now empty pack SP' until the latch 56 passes the far end FE thereof nearest to the pick-up station 26, and rises, as shown in FIG. 19, behind the bottom of the pack SP' at its end FE. after which the motor 50 is actuated to retract the ram 54 in a single step, to its starting position, as shown in FIG. 20. The latch 56, thus engages the pack SP' and drives it as the ram 54 is retracted, towards the end 32 of the frame 28 and thence out of the apparatus 24 as shown in FIG. 20. The elevator 44 is then returned to its fully raised pack pick-up position by the linkages 46, that is to say to its FIGS. 12 and 15 position.

After the removal of the slide pack SP' from the stack the next following slide pack SP which thereby became the lowermost slide pack, was depressed by the weight of the stack so that its flanges LF rested upon the inner horizontal arms of the star wheels 72 which were, at that time, latched, as described below, against rotation. Following the first cycle of operation described above, the elevator 44 is raised to its fully raised pack pick-up position, so that the cam surfaces 64 of the arms 66 engage the flanges LF of the now lowermost pack SP and are thereby pushed back, and subsequently resile to, cause these flanges LF to be gripped between the heads 68 of the arms 66 and said inner horizontal star wheel arms. The rise of the elevator 44, causes the star wheels to be unlatched as described below so that they rotate by a further 90 degrees, and a further cycle operation of apparatus 24 is carried out.

The apparatus will now be described in greater detail.

As shown in FIGS. 21 to 23, in respect of one of the star wheels 72, each arm 70 of each wheel 72, is provided with an axially projecting stud 80 proximate to its free end. As best seen in FIGS. 4 and 12 to 15, each side wall 82 of the upper magazine part 36 of the frame 28 has thereon a spring loaded latch block 84 which is slidable vertically upwardly against the action of a return spring 86 and has an abutment 88 projecting inwardly of the part 36. As the elevator 44 rises towards its pack pick-up fully raised position, a latch actuator projection 90 on the adjacent arm 62 of the elevator 44 engages the abutment 88 of the latch block 84 so as to drive it upwardly against the action of its spring 86. Prior to this upward movement of the block 84, the stud 80 on the adjacent star wheel arm 70 engaged the block 84 as shown in FIG. 21, thereby securing the star wheel 72 against rotation so as to support the lowermost pack of the stack. As the elevator 44 continues to rise, that stud 80 enters an upwardly inclined through opening 86' in the block 84, as will be apparent from FIG. 22, so that the star wheel 72 is free to rotate under the weight of the stack of slide packs, the stud 84 passing out of the opening 86' as shown in FIG. 23 and the star wheel 72 continuing to rotate, that is to say through 90 degrees, until, as the elevator 44 begins to descend, the projection 88 passes out of the opening 86' as the block 84 is pushed downwardly by its spring 86, and the projection 80 on a next adjacent arm 70 of the star wheel 72 engages the block 84 as shown in FIG. 21 locking the star wheel against rotation. The elevator 44 is guided for precise vertical movement by means of a guide key 87 which runs on rollers 89 behind, as seen in FIG. 3, a frame plate 93.

As best seen in FIGS. 1 and 4, the magazine part 36 of the frame 28 comprises a pair of pack guides 91, each defining a pack receiving a channel 92 and having end walls 94 to prevent escape of the packs SP in their longitudinal direction.

As shown in FIGS. 24 and 25, the chain 52 comprises links 96 connected by pivot pins 98 which engage between teeth 100 of the sprocket wheel 48. Each link 96 comprises two opposed and vertically offset projections 102 and 104 one at each end of the link. As the upper flight of the chain 52 moves of the sprocket wheel 48, the projection 102 of one link engages beneath the projection 104 of the next adjacent link so that the ram 54 is in abutment with connectors C in the pack SP', the chain 52 does not buckle. The links 96 are thus relatively rotatable only in a direction to enable the chain 52 to engage about the sprocket wheel 48, which is rotatable about the axis of a horizontal shaft 106. The lower flight of the chain 52 is accommodated in a channel 107 beneath a base plate 109 of frame 28. The apparatus may be provided with extensible mounting legs 97, one of which is shown in FIG. 3.

Figure 11:
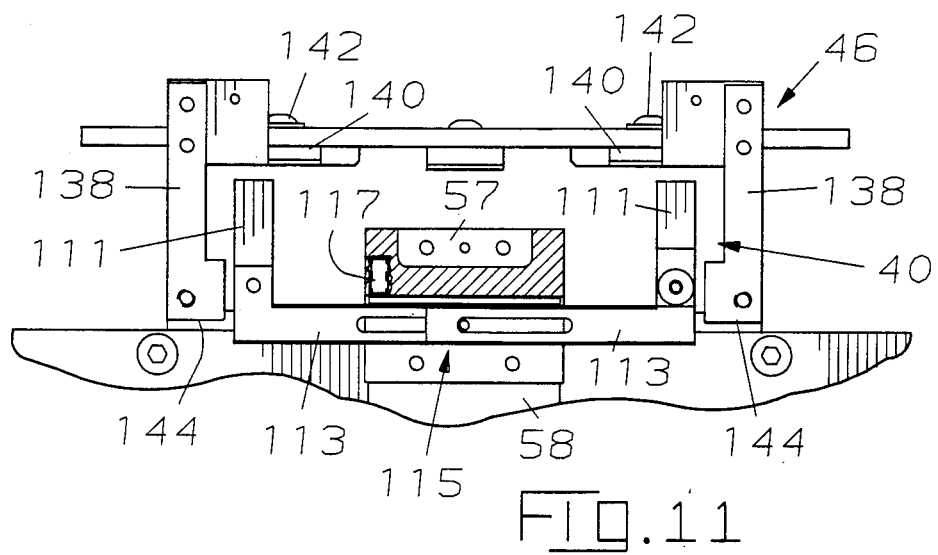
FIG. 11 is a view taken on the lines 11—11 of FIG. 9.

The connector pick-up station 26, as best seen in FIGS. 5, 6, 9 and 11, comprises a connector locating comb 108 which is removably secured in a recess 57 in the top of the slide 58, by means of screws 61, so that the comb 108 can be reversed for use with different connectors. The slide 58 is secured to shafts 110 which are slidable in a bearing block 112, being connected to the piston rod 114 of the unit 60 by a yoke 116. The slide 58 carries connector abutment blocks 111 mounted on arms 113 which are adjustable for connector length through screw and slot adjustment means 115 comprising a set screw 117 (FIG. 11). The unit 60 is actuable to retract its piston rod 114 and thus to raise the slide 58, by means of sensors 120 (FIG. 10) which are engaged by the leading connector C' of the row of connectors in the tray 40. As shown in FIG. 6A, the slide 58 thereby raises the connector C' above the remaining connectors in the tray 40, the comb 108 projecting between two rows of contact tails T depending from the connector C' and spring loaded plungers 122, in front blocks 123 on connector guide plates 138, pushing the connector C' back, so that the contact tails T of the right hand (as seen in FIG. 6A) row of tails T each enter a respective groove 124 in the comb 128 whereby the connector is precisely located relative to the comb, for pick-up by the jaws 19 of the robot 2.

As best seen in FIGS. 3, 7 and 15 to 20, each linkage 46 comprises two pivotally connected links 126 and 128, the link 126 being a driven link and being drivable between the positions in which the links are shown in FIGS. 15 to 20, by means of a Geneva wheel 130 through right angle drives 131. The wheel 130 is driven by a cam follower block 133 on an intermediate wheel 132 having pins 137 for engaging in the slots of the wheel 130 and being driven by a unidirectional motor 134 through a pinion 135 so that the elevator 44 is driven seqentially to its pack pick-up position, its connector feed position, and its pack eject position, through the linkages 46. The motor 134 is controlled by circuitry (not shown) so that the sequence of operation of the elevator 44 is correctly timed.

As shown in FIGS. 5, 6, 9, 10 and 11, the tray 40 has a cover plate 141 from which depend the connector guide plates 138 on slides 140, secured to the plate 141 by screw 142, and slot 143, connections, so as to be adjustable for connector length. The plates 138 are also mounted on slides 144 on a subframe 145 carrying the tray 40.

The sensors 120, which are pneumatic sensors, only the air nozzles of which are shown, are provided on the connector guide plates 138. Further pneumatic sensors 148 above the sensors 120, and only the air nozzles of which are shown, are also provided on the plates 138 for sensing the pick-up of the connectors by the robot jaws 19, to actuate the unit 60 to return its piston rod 114 to its advanced position to lower the slide 58. The sensors 120 and 148 act upon the unit 60 by way of a pneumatic switch box 150 (FIG. 9) on the subframe 145.

Figure 26:
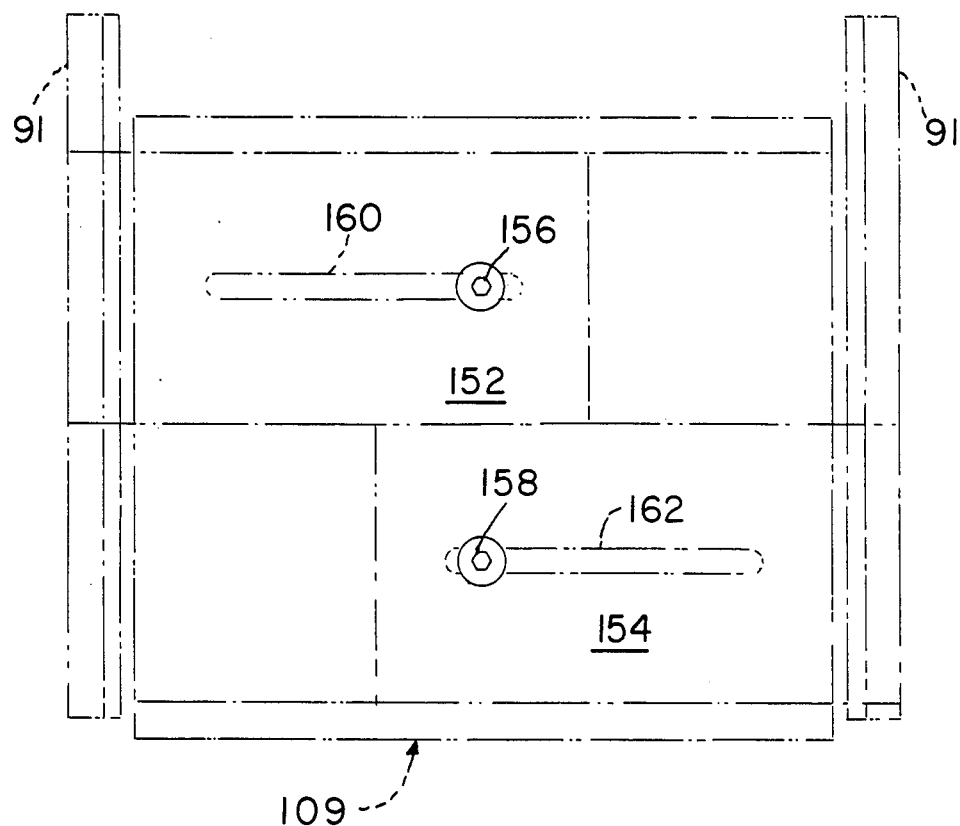
FIG. 26 is a diagrammatic sectional view taken on the lines 26—26 of FIG. 4.

As shown diagrammatically in FIG. 26, the pack guides 91 are mounted for adjustment as to connector width, upon respective calibrated sides 152 and 154 in the base plate 109, the slides being securable in desired positions of adjustment transversely of the plate 109, by means of screws 156 and 158 engaging in slots 160 and 162 in the slides 152 and 154, respectively.

Each guide 91 has thereon a pack pick-up arm gauging lever 164 (one of which is shown in FIG. 4). The pack pick-up arms 62 are mounted on slides in the elevator 44 for adjustment as to connector width, these slides being similar to the slides 152 and 154 but being uncalibrated. In setting up the apparatus, the slides 152 and 154 are first adjusted for connector width and the levers 164 are swung from a vertical position to a horizontal position in which the lever 164 in FIG. 4 is shown. With the elevator 44 in its raised position, the arms 62 are moved outwardly on their slides until each arm 62 engages the adjacent lever 164, as indicated in broken lines in FIG. 4. The slides of the arms 62 are then secured in position and the levers 164 are returned to their horizontal positions.

It should be noted that for continuous operation of the robot 2 the last connector is fed from the pack (SP′) immediately after the robot (2) has picked up a leading connector C′ from the pick up station 26. Thus the empty pack SP′ is ejected and the next pack is picked up from the stack and placed in the connector feed position, whilst the jaws 19 of the robot 2 are being moved to the circuit board 22 and back again to the pick-up station 26.

We claim:

1. Apparatus for sequentially feeding electrical connectors arranged in rows in elongate tubular packs, for pick-up by connector pick-up means, the apparatus comprising:

an elongate frame having a first end, a second end, a lower part, and an upper magazine part for containing a vertical stack of said packs with said packs extending lengthwise of the frame;

a pack transfer elevator mounted in the lower part of the frame for vertical movement towards and away from said upper part, between a pack pick-up raised position, a connector feed lowered position and a pack eject intermediate position;

a connector pick-up station beyond the first end of the frame and in alignment with said elevator when it is in its connector feed position;

a connector feed and pack eject ram mounted to the frame for movement from said second end thereof towards and away from said connector pick-up station, said ram having pack engaging means thereon; and means for actuating said elevator and said ram, to cause, consecutively, said elevator to move to its pack pick-up position to pick up the lowermost pack of the stack, said elevator to move to its connector feed position, said ram to advance intermittently from said second end of the frame and through said lowermost pack to feed each connector therein in turn, to said connector pick-up station, said ram to retract from said lowermost pack, towards said second end, said elevator to be raised to its pack eject position, said ram to be advanced beneath said pack so that said pack engaging means thereon engages said lowermost pack, and said ram to be retracted towards said second end of the frame to eject said lowermost pack from the apparatus.

2. Apparatus as claimed in claim 1, further comprising a flexible ram carrier and rotary drive means for driving said ram carrier to drive said ram towards and away from said pick-up station, said pack engaging means comprising a resiliently depressable latch member on the ram.

3. Apparatus as claimed in claim 2, wherein said flexible member is in the form of a chain having links which are relatively rotatable only in a direction to enable said chain to engage about said rotary drive means, the axis of rotation of said drive means being horizontal.

4. Apparatus as claimed in claim 1, wherein said elevator is provided with a slide-way for said ram, said slide-way extending lengthwise of said frame.

5. Apparatus as claimed in claim 1, further comprising escapement means for supporting lowermost pack in said upper magazine part of the frame and means on said elevator for actuating said escapement means to release said lowermost pack, as said elevator rises to its pack pick-up position.

6. Apparatus as claimed in claim 5, wherein said escapement means, comprises a plurality of star wheels having pack supporting arms and being mounted on the upper part of said frame, said release means comprising a spring loaded abutment for each star wheel, the abutments being mounted to the upper part of the frame, and abutment engaging members on said elevator, each abutment being urged towards a first position to inhibit rotation of the associated star wheel and being movable to a second position to permit rotation thereof by an adjacent one of said abutment engaging members.

7. Apparatus as claimed in claim 1, comprising linkage means connecting said elevator to said frame, and unidirectionally rotatable drive means connected to said linkage means for driving said elevator consecutively between its pack pick-up, its connector feed, and its pack eject positions.

8. Apparatus as claimed in claim 1, comprising means on said elevator for grasping said lowermost pack, upon the elevator reaching its pack pick-up position, with the pack spaced from the elevator at least by the height of the ram.

9. Apparatus as claimed in claim 1, comprising means connected to the frame for raising each connector at the pick-up station, means for actuating the raising means upon arrival of the connector at the pick-up station, and means for locating the connector, when it has been raised by the raising means, in a predetermined position at the pick-up station.

10. Apparatus as claimed in claim 9, wherein said raising means comprises a vertically movable slide, and drive means for said slide, and said positioning means comprises a comb fixed to said slide and means for urging each connector at the pick-up station towards said comb when the slide is in a raised position, to engage the tails of terminals depending from said connector against said comb.

11. Apparatus as claimed in claim 1, further comprising a connector tray extending between said elevator and said pick-up station, for receiving connectors fed from said pack by said ram, in horizontally stacked relationship.

12. Apparatus as claimed in claim 11, comprising means on said tray for opening a hinged flap closing the adjacent end of said pack as said elevator is moved to its connector feed position.

13. Apparatus for sequentially feeding electrical connectors arranged in rows extending lengthwise of elongate, rectangular cross section, tubular packs, for pick-up by a robot gripper head, the apparatus comprising:

an elongate frame having a first end, a second end, a lower part, and an upper magazine part containing a vertical stack of said packs with the packs extending lengthwise of the frame;

releasable escapement means connected to said upper part and supporting the lowermost pack of the stack;

a pack transfer elevator extending beneath said stack for substantially the whole length thereof and being mounted in the lower part of the frame for vertical movement towards and away from said upper part, between a pack pick-up position adjacent to said lowermost pack, a connector feed position below said stack and a pack eject intermediate position located above said lowered position;

a connector pick-up station located beyond the first end of the frame at the level of said connector feed position of said elevator;

a connector collecting tray between said elevator and said pick-up station;

a connector feed and pack eject ram having a depressable pack latch thereon and being mounted in the lower part of the frame for movement from the first end thereof horizontally towards and away from said connector pick-up station;

means for driving said elevator consecutively between its pack pick-up, connector feed, and pack eject positions; and and ram driving means for consecutively driving the ram from said second end of the frame and step by step through a pack on the elevator to position each connector therein in turn at the pick-up station, for retracting the ram from the pack on the elevator, for advancing the ram beneath the pack, in the eject position of the elevator to engage said latch on the ram with that end of the pack on the elevator, which is nearest to the pick-up station and for again retracting the ram to eject the pack engaged by the latch member from the apparatus.

14. Apparatus as claimed in claim 13, comprising means at the pick-up station for raising each connector upon arrival thereat and for horizontally positioning the connector for pick-up by the pick-up head.

15. Apparatus as claimed in claim 13, comprising means on the elevator, for retaining a pack in position thereon when the pack has been picked up by the elevator.

* * * * *